(12) United States Patent
Truessel et al.

(10) Patent No.: US 11,502,434 B2
(45) Date of Patent: Nov. 15, 2022

(54) POWER SEMICONDUCTOR MODULE

(71) Applicant: Hitachi Energy Switzerland AG, Baden (CH)

(72) Inventors: Dominik Truessel, Bremgarten (CH); Samuel Hartmann, Staufen (CH); Fabian Fischer, Baden (CH); Harald Beyer, Lenzburg (CH)

(73) Assignee: Hitachi Energy Switzerland AG, Baden (CH)

( * ) Notice: Subject to any disclaimer, the term of this patent is extended or adjusted under 35 U.S.C. 154(b) by 506 days.

(21) Appl. No.: 16/703,942

(22) Filed: Dec. 5, 2019

(65) Prior Publication Data

US 2020/0112111 A1  Apr. 9, 2020

Related U.S. Application Data

(63) Continuation of application No. PCT/EP2018/064799, filed on Jun. 5, 2018.

(30) Foreign Application Priority Data

Jun. 7, 2017 (EP) ..................................... 17174651

(51) Int. Cl.
  *H01R 12/58* (2011.01)
  *H05K 3/30* (2006.01)
  *H01L 23/498* (2006.01)

(52) U.S. Cl.
  CPC ...... *H01R 12/585* (2013.01); *H01L 23/49811* (2013.01)

(58) Field of Classification Search
  CPC ... H01R 12/585; H01R 12/7088; H01L 23/50; H01L 23/5286; H01L 23/49811; H05K 3/308
  See application file for complete search history.

(56) References Cited

U.S. PATENT DOCUMENTS

| | | | |
|---|---|---|---|
| 2003/0015778 A1 | 1/2003 | Soyano et al. | |
| 2008/0157680 A1* | 7/2008 | Tominaga | H05K 7/20854 315/112 |
| 2008/0158823 A1 | 7/2008 | Tominaga et al. | |
| 2010/0176505 A1 | 7/2010 | Oyama et al. | |

(Continued)

FOREIGN PATENT DOCUMENTS

| | | |
|---|---|---|
| CN | 106252336 A | 12/2016 |
| EP | 0696881 A1 | 2/1996 |

(Continued)

OTHER PUBLICATIONS

European Patent Office, International Search Report & Written Opinion issued in corresponding Application No. PCT/EP2018/064799, dated Aug. 29, 2018, 10 pp.

*Primary Examiner* — Hoa C Nguyen
(74) *Attorney, Agent, or Firm* — Slater Matsil, LLP

(57) ABSTRACT

A power semiconductor module includes a housing accommodating a power circuit with at least one power semiconductor chip, the housing providing at least two power terminals; a printed circuit board mounted to the housing and electrically connected to the power circuit for distributing auxiliary signals; and at least one auxiliary terminal mounted to the printed circuit board with a press-fit connection provided by a body of the auxiliary terminal.

20 Claims, 5 Drawing Sheets

(56) References Cited

U.S. PATENT DOCUMENTS

| | | | | |
|---|---|---|---|---|
| 2011/0216507 | A1* | 9/2011 | Kadomoto | H05K 7/20 |
| | | | | 361/714 |
| 2012/0320545 | A1* | 12/2012 | Lo Presti | H05K 7/1432 |
| | | | | 361/752 |
| 2013/0100632 | A1* | 4/2013 | Ibori | H02M 7/003 |
| | | | | 361/807 |
| 2014/0167235 | A1* | 6/2014 | Horie | H01L 23/4334 |
| | | | | 257/669 |
| 2014/0285985 | A1* | 9/2014 | Tanaka | H05K 5/0069 |
| | | | | 361/752 |
| 2015/0163962 | A1* | 6/2015 | Suzuki | H02M 7/003 |
| | | | | 361/699 |
| 2015/0351276 | A1 | 12/2015 | Yasutomi et al. | |
| 2016/0037654 | A1* | 2/2016 | Kosuga | H02M 7/003 |
| | | | | 361/807 |
| 2016/0365295 | A1 | 12/2016 | Hoegerl et al. | |
| 2017/0063071 | A1 | 3/2017 | Yoneyama et al. | |
| 2017/0222570 | A1* | 8/2017 | Okubo | H02M 1/08 |

FOREIGN PATENT DOCUMENTS

| | | |
|---|---|---|
| EP | 2216814 A2 | 8/2010 |
| EP | 2897276 A2 | 7/2015 |
| GB | 2487185 A | 7/2012 |
| JP | H07115287 A | 5/1995 |
| JP | 2003051560 A | 2/2003 |
| JP | 2011210990 A | 10/2011 |
| JP | 2017046529 A | 3/2017 |
| WO | 2015007507 A1 | 1/2015 |

* cited by examiner

POWER SEMICONDUCTOR MODULE

FIELD OF THE INVENTION

The invention relates to a power semiconductor module.

BACKGROUND OF THE INVENTION

A power semiconductor module accommodates one or more power semiconductor chips, which may be electrically connected with terminals provided on a housing of the power semiconductor module. Power terminals are used for interconnecting conductors carrying the load current of the power semiconductor module. Auxiliary terminals, which usually have a much lower current rating as the power terminals, are used for supplying gate signals, accessing sensor signals, etc.

Some power semiconductor modules have a printed circuit board on which the auxiliary terminals are provided. The printed circuit board is electrically connected to the interior of the power semiconductor module and the auxiliary terminals may be soldered to the printed circuit board. The auxiliary terminals may protrude through a module cover above the printed circuit board and the auxiliary terminals may be bent over nuts, which are kept in the module cover.

For example, emitter, collector and gate signal from a gate driver board may be connected via the auxiliary terminals to the printed circuit board and the printed circuit board may then distribute the signals to a substrate onto which one or more power semiconductor chips are attached.

The auxiliary terminals may be soldered to the printed circuit board in un-bent condition. After that, the printed circuit board may be glued on a grid which is part of the housing. Then, wire bond connections from the printed circuit board to the substrates may be attached. In the next step, the module cover may be mounted on top of the housing. The module cover may have slot openings to feedthrough the un-bent auxiliary terminals. After placing the nuts in the cover, the auxiliary terminals may be bent over the nuts by a bending process. During mounting, in application, or in shock- and vibration tests, the forces to the solder joints of the auxiliary terminals to the printed circuit board may be quite high. Since the auxiliary terminals may be guided by the module cover, some forces to the solder joints may be reduced. However, there may be still a risk of creating cracks in the solder due to high stress.

US 2003 015 778 A1 shows a semiconductor device with externally lead control terminals, which are insert molded in a control terminal block constituting an independent component.

EP 0 696 881 A1 relates to a plastics housing having openings for terminals of a power module, that is sealed by elastic elements between the power module and an inner housing surface.

US 2008/158 823 A1 shows auxiliary terminals, which on one end have a press-fit connection for being plugged into a printed circuit board of a power module. The other ends protrude from a housing of the power module.

US 2012/320 545 A1 shows press-fits with protrusions, which may be used as output terminals. The press-fits are inserted into a circuit board of a power module.

US 2015/351 276 A1 shows a nut box, which is provided below an electrode of a power module.

DESCRIPTION OF THE INVENTION

It is an objective of the invention to provide a reliable, flexible and economic power semiconductor module, which has auxiliary terminals bent over nuts.

This objective is achieved by the subject-matter of the independent claims. Further exemplary embodiments are evident from the dependent claims and the following description.

The invention relates to a power semiconductor module. A semiconductor module may be any device composed of one or more semiconductor chips, their electrical and mechanical interconnections and a housing for these components. The term "power" here and in the following may refer to modules and/or semiconductor chips adapted for processing current of more than 100 V and/or more than 10 A.

According to an embodiment of the invention, the power semiconductor module comprises a housing accommodating a power circuit with at least one power semiconductor chip, which housing provides at least two power terminals. For example, the housing may be made of plastics and may comprise a baseplate to which the one or more power semiconductor chips are attached. One or more substrates may be bonded to the base plate and one or more power semiconductor chips may be bonded to the one or more substrates. The plastics material of the housing may be a glass fiber reinforced thermoplastics material.

The baseplate may comprise a metallisation layer to which the one or more power semiconductor chips are bonded. The power terminals may be provided by openings in the housing, in which nuts are accommodated, to which a conductor, such as a cable, may be screwed.

For example, the power semiconductor module may be a half-bridge module, in which the power circuit comprises two series-connected power semiconductor switches. The middle point and end points of this series-connection may be electrically interconnected with the power terminals. In general, the power semiconductor module may comprise more than one power semiconductor chip.

The power semiconductor module further comprises a printed circuit board mounted to the housing and electrically connected to the power circuit for distributing auxiliary signals, at least one auxiliary terminal mounted to the printed circuit board with a press-fit connection provided by a body of the auxiliary terminal. An auxiliary terminal may be a possibly bent metal strip and/or may be made of copper.

The printed circuit board may be seen as an internal printed circuit board for control and or measurement signal distribution, which may be electrically connected to power circuit and/or to sensors inside the housing. For example, the auxiliary terminal may be electrically connected to a gate of a power semiconductor chip. Furthermore, an auxiliary terminal may be connected to our collector of the power semiconductor chip for providing an auxiliary collector connection. It is also possible, that an auxiliary terminal is connected to a sensor inside the housing of the power semiconductor module, for example temperature sensor.

The printed circuit board may be connected to a specific plastics frame and/or support structure that is provided by the housing. The printed circuit board may be based on plastics material, for example on glass-reinforced epoxy material.

One or more auxiliary terminals may be mounted to the internal printed circuit board. One end of each auxiliary terminal, i.e. the body, is press-fitted into the printed circuit board. Using a press-fit connection inside of the power semiconductor module may be more reliable than soldering.

Additionally, the power semiconductor module further comprises at least one terminal support mounted to the printed circuit board, the terminal support having a support channel through which the auxiliary terminal is guided with its body. The other end of the auxiliary terminal, i.e. a head, may protrude out of the terminal support for electrically connecting a conductor, such as a cable.

The terminal support, which may be a plastics component, mechanically supports the auxiliary terminal. For example, the terminal support may be made of a plastics material, such as a thermoplastic material or epoxy material. The terminal support may be mounted to the printed circuit board and/or may at least partially surround the body of the auxiliary terminal. The body of the auxiliary terminal may be guided in a support channel that completely or at least partially embeds the body.

The terminal support has at least one pin, which is plugged into a hole in the printed circuit board. The terminal support may have two or more pins, which are placed in through-holes in the printed circuit board. Such a connection structure between the terminal support in the printed circuit board may take the torque forces, which are generated during connection of the head of the auxiliary terminal with a further conductor, for example during mounting of a gate driver board.

Furthermore, the head of the auxiliary terminal may be bent and/or may be deposited on the terminal support. The terminal support in combination with the press-fit connection of the auxiliary terminal may provide additional robustness for the electrical interconnection of the auxiliary terminals.

According to an embodiment of the invention, the terminal support has an opening accommodating a nut. For example, the opening for the nut is aligned substantially parallel to the support channel for supporting the body of the auxiliary terminal. The nut may be inserted and/or pressed into the terminal support, before the auxiliary terminal is put into the terminal support.

According to an embodiment of the invention, the auxiliary terminal is bent, such that a head of the auxiliary terminal protrudes over the nut. For example, the body may be aligned substantially orthogonal to the printed circuit board and or the head may be aligned substantially parallel to the printed circuit board. The head of the auxiliary terminals may have one bending and a screw hole. The head may be arranged below the screw hole. This makes it possible to use already pre-bent auxiliary terminals. No additional bending process is needed during the assembly of the power semiconductor module.

According to an embodiment of the invention, the auxiliary terminal comprises a head with a second press-fit connection for a further printed circuit board. For example, also the head may comprise a press-fit connection with one or more press-fit pins to which a further printed circuit board may be connected. Such a further printed circuit board may be a gate driver board.

According to an embodiment of the invention, the body of the auxiliary terminal has a barbed structure for anchoring the auxiliary terminal in the terminal support and/or in the support channel. The body of the auxiliary terminal may have a "saw tooth" structure and/or another rough surface to ensure a strong mechanical connection between the auxiliary terminal and the plastics material of the terminal support, which may prevent pull-out from the terminal support. The auxiliary terminal may be pressed into the terminal support, for example before or after the terminal support is mounted to the printed circuit board.

According to an embodiment of the invention, the auxiliary terminal is insert moulded into the terminal support.

According to an embodiment of the invention, the body of the auxiliary terminal has two press-fit pins aligned parallel with the body. Such a press-fit pin, which may be a bulged pin with an eyelet, may be pressed into a corresponding through-hole in the printed circuit board that is lined with a metallisation layer.

According to an embodiment of the invention, a pin of the terminal support is deformed to fix the terminal support on the printed circuit board. For example, the pin may be deformed by ultrasonic welding, such that the head of the pin becomes thicker than the corresponding through-hole. For example, the pin to be deformed may be a pin longer than the other pins, which pin is placed in a through-hole of the printed circuit board in such a way that an end of the pin is standing over the printed circuit board. This longer pin will then may be deformed by a thermal process, such as ultrasonic welding or a similar thermal forming process, to mechanically attach the terminal support to the printed circuit board. The deformed pin may take all external push and pull forces and/or may secure the press-fit connection of the auxiliary terminal to the printed circuit board.

Additionally or alternatively, the terminal support part may have pins fed through through-holes in the printed circuit board for locking the rotation and transferring mounting torque to the printed circuit board. Such pins may be flush with the surface of the printed circuit board.

According to an embodiment of the invention, the printed circuit board is Sn coated at the press-fit connection. The printed circuit board, which may have one or more metallisation layers on one or more of its sides may be selectively Sn-coated at the location of the press-fit holes. This may prevent corrosion and thus may yield to more robust press-fit connection. This may be due to the fact that a Sn—Sn connection may form a gas-tight cold shut.

According to an embodiment of the invention, the housing of the power semiconductor module is filled with a filling material into which the press-fit connection of the auxiliary terminal is embedded. The power semiconductor module may be filled with silicone gel to level above the printed circuit board. In such a way, the press-fit connection, i.e. a part of the body of the auxiliary terminal, the press-fit pins and the through-holes, in which the press-fit pins oppressed, are completely embedded into the filling material. The gel may be used for electrically isolating the components embedded into it.

According to an embodiment of the invention, the power semiconductor module further comprises a module cover attached to the housing above the printed circuit board, wherein the module cover has an opening for guiding the terminal support. In other words, the head of the auxiliary terminal and/or the terminal support may be guided through an opening in the module cover, which also may be made of plastics material, for example the same material as the housing of the power semiconductor module. The openings in the module cover may have the same shape as the terminal support, for example, to seal the space below the module cover port. With the module cover, the power semiconductor module may be closed after the process of electrically interconnecting the printed circuit board with the power circuit and/or one or more sensors.

According to an embodiment of the invention, the printed circuit board is connected via wire bonds with the power circuit. The electrical connection of the printed circuit board to the interior of the power semiconductor module may be done by wire bonding. For example, the printed circuit board may have openings to which these wire bonds are guided below the printed circuit board, where the one or more semiconductor chips of the power semiconductor module are arranged.

According to an embodiment of the invention, the printed circuit board is coated with at least one of Ni or Au, where a wire bond is attached to the printed circuit board. The printed circuit board and in particular its metallisation layer may be selectively coated with Ni and/or Au where a wire bond is connected. In such a way, dedicated bond pads may be provided on the printed circuit board.

According to an embodiment of the invention, a rubber element is provided between the printed circuit board and the housing of the power semiconductor module. Such a rubber element, which may be a strip of rubber, may damp vibrations generated during ultrasonic welding of the wire bonds. A reduction of vibrations may result in a higher quality of the ultrasonic welded bond connection.

For example, the rubber element may be arranged between the printed circuit board and support structure of the housing, onto which the printed circuit board is placed. The rubber element may be made of a silicone based rubber material, or similar material. For example, the shore A value of the rubber material may be between 10 and 90, for example about 30. The rubber element may be an integrated part of the housing, which, for example, may be produced by two component injection moulding.

According to an embodiment of the invention, the rubber element is provided below wire bonds attached to the printed circuit board. For example, all wire bond connections and or bond pads of the printed circuit board may be provided on one side of the printed circuit board, below which the rubber element is positioned. The other side of the printed circuit board may be directly positioned on the support structure provided by the housing, onto which the printed circuit board is placed.

According to an embodiment of the invention, the printed circuit board comprises holes for receiving bolts protruding from the housing of the power semiconductor module. The support structure of the housing of the power semiconductor module may comprise fixation bolts, onto which the power semiconductor module is placed.

According to an embodiment of the invention, the rubber element comprises openings through which the bolts are guided. The rubber element may be fixated on the support structure of the housing of the bolts. Furthermore, at least one bond pad may be located close to a line connecting two fixation bolts.

According to an embodiment of the invention, at least one of the bolts comprises a stop with a diameter larger than the corresponding opening in the circuit board, wherein the rubber element is compressed by the printed circuit board pressed against the housing. Such a stop may be formed by a part of the board having a larger diameter at a base. I.e. the tip or head of the board may be smaller than its base. Such a stop may be implemented to define a gap between the printed circuit board and the support structure of the housing. Inside the gap, the rubber element is then under compression, when the printed circuit board is pressed onto the stop.

The initial thickness of the rubber element may be thicker than the gap and/or the stop. For example, the initial thickness of the rubber element may be between 0.5 mm and 2 mm, for example about 1 mm. The compression of the rubber element may be in the range of 5% to 40%, for example about 20%.

According to an embodiment of the invention, a head of at least one bolt is deformed to form a cap to fix the printed circuit board to the housing. In such a way, the printed circuit board may be fixed to the support structure of the housing without any gluing. A time-consuming process step in which glue has to be cured may be avoided. With the one or more deformed bolts, the printed circuit board may be pressed continuously onto the rubber element, i.e. the one or more caps may keep the printed circuit board pressed on the rubber element. For example, the one or more bolts may be deformed by vibration welding and/or heat to form the cap.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
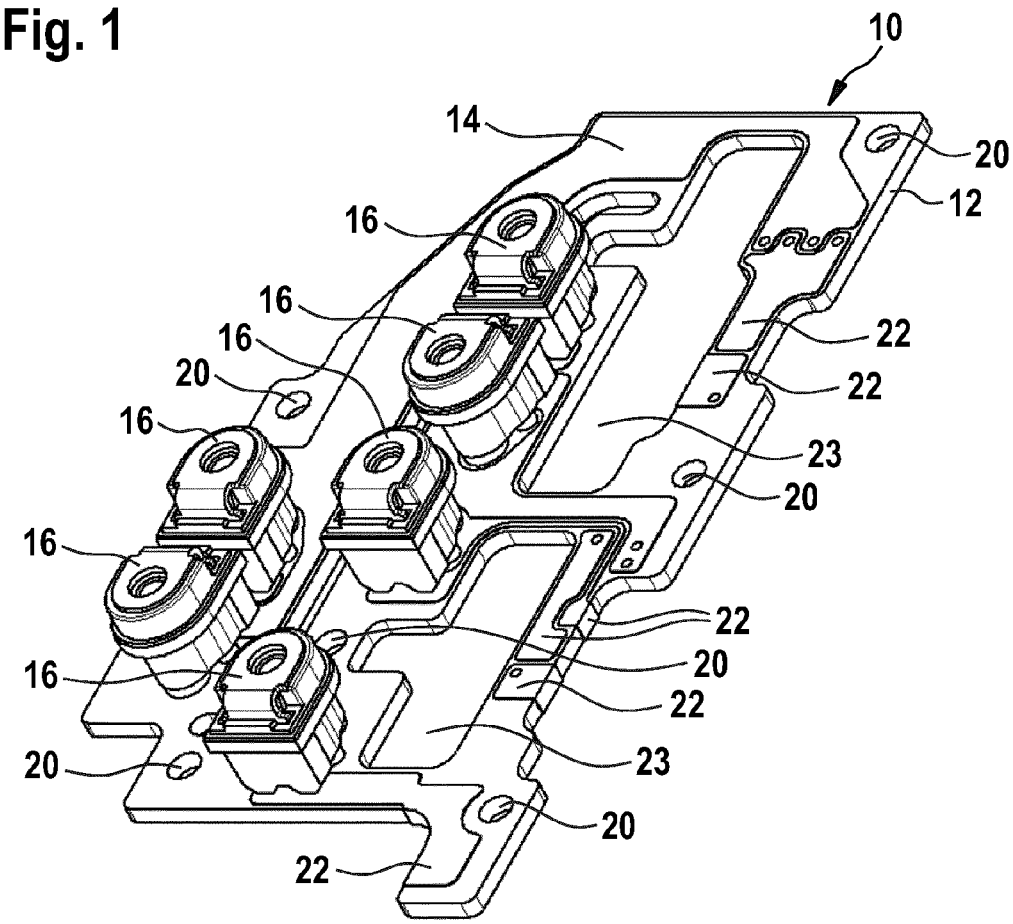
FIG. 1 shows a perspective view of a printed circuit board for a power semiconductor module according to an embodiment of the invention.
Figure 5:
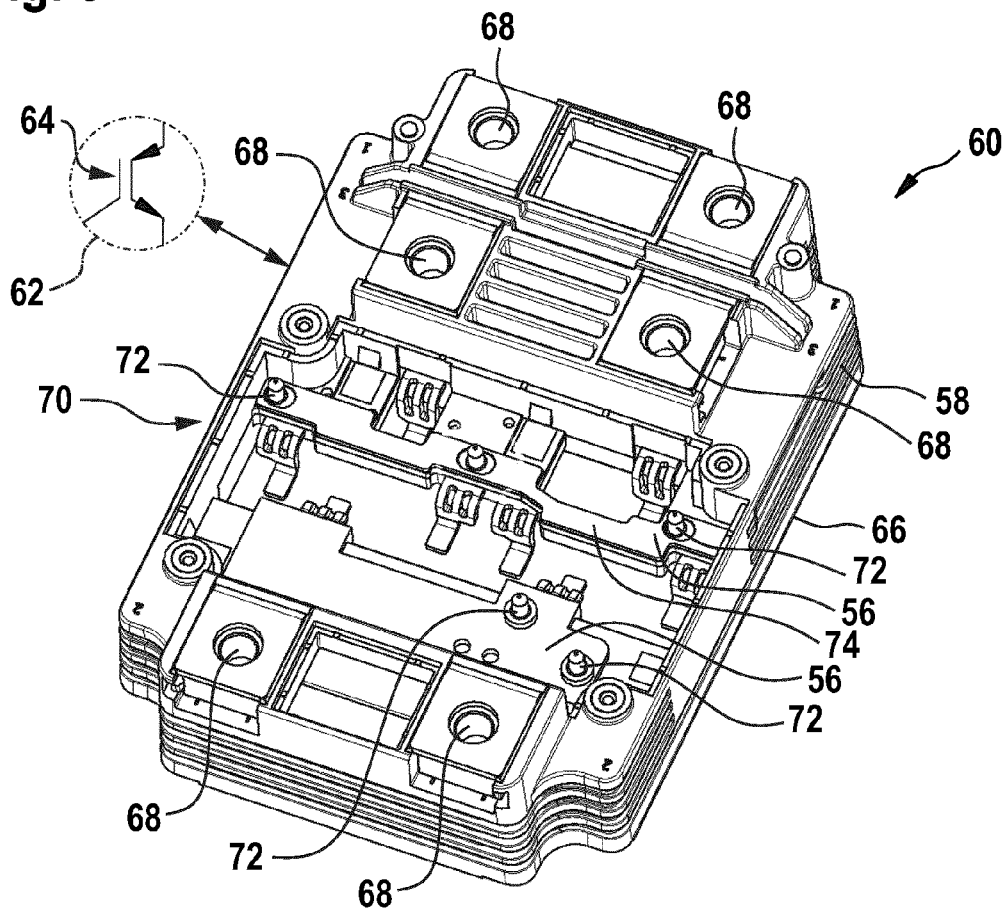
FIG. 5 shows a perspective view a power semiconductor module according to an embodiment of the invention during a first manufacturing step.
Figure 7:
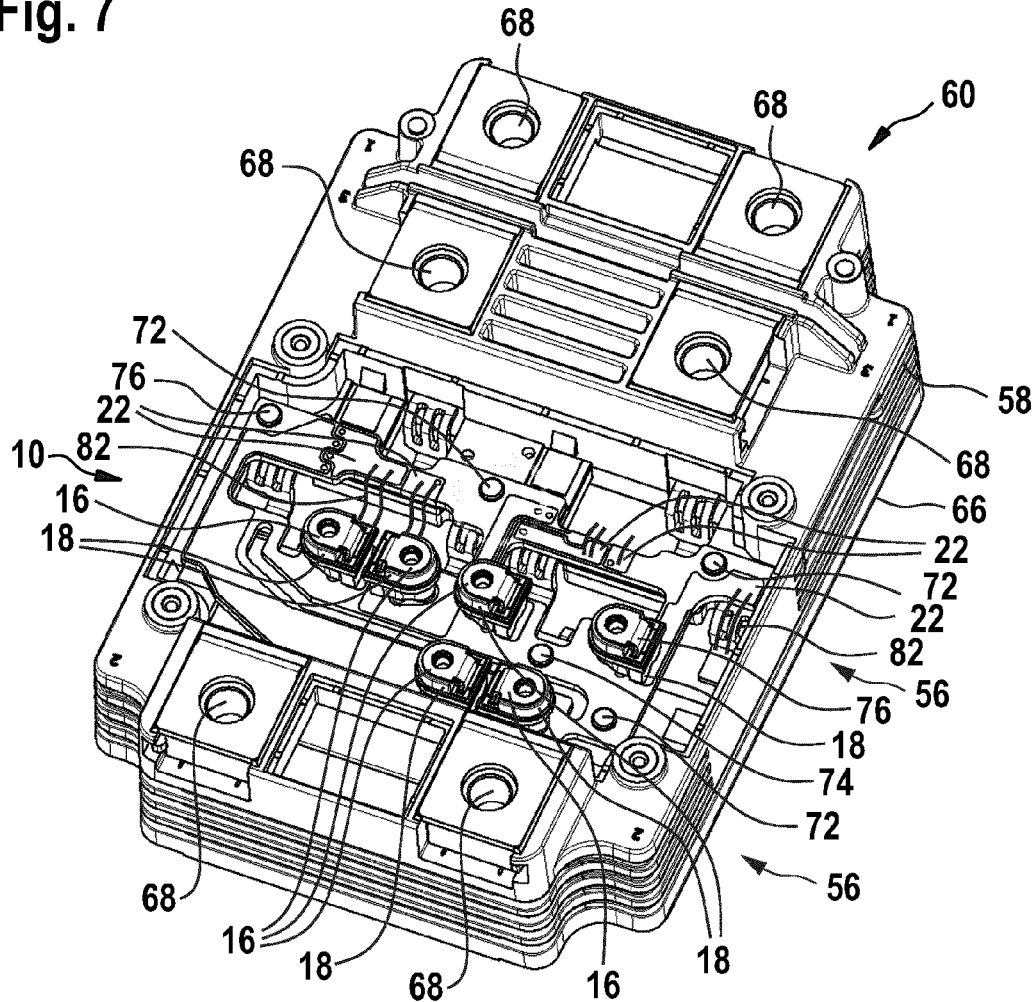
FIG. 7 shows a perspective view of the power semiconductor module of FIG. 5 during a second manufacturing step.

FIG. 1 shows a printed circuit board 10, which comprises a substantially planar plastic body 12 onto which one or more structured metallisation layer 14 is provided. For example, two metallisation layers 14 may be provided on both sides of the printed circuit board 10. On the plastic body 12, several (here six) auxiliary terminals 16 are arranged, which are electrically interconnected with the one or more metallisation layers 14. Each of the auxiliary terminals 16 is mechanically supported by a terminal support 18, a plastic component mechanically interconnected with the plastic body 12 of the printed circuit board 10. The printed circuit board 10 may be mounted to a power semiconductor module that is shown in FIGS. 5 and 7.

The printed circuit board 10 comprises several through-holes 20 that are used for connecting the printed circuit board 10 to a housing of the power semiconductor module. On the planar plastic body 12, bonding areas or bond pads 22 are provided that are used for wire bonding the printed circuit board 10 to further electrical components of the power semiconductor module. The bond pads 22 are all arranged on one side of the printed circuit board 10. Additionally, openings 23 are provided in the plastic body 12, through which wire bonds attached to the bond pads 22 may be guided. The bond pads 22 may be coated with Ni or Au.

Figure 2:
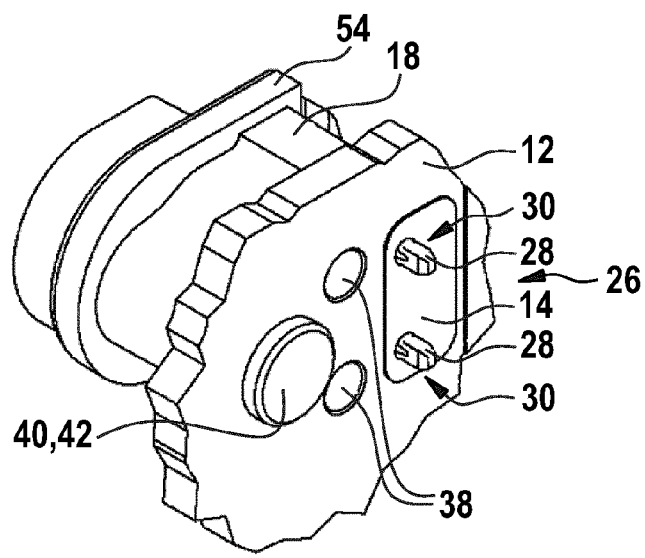
FIG. 2 shows a part of the printed circuit board of FIG. 1 with terminal support.
Figure 3:
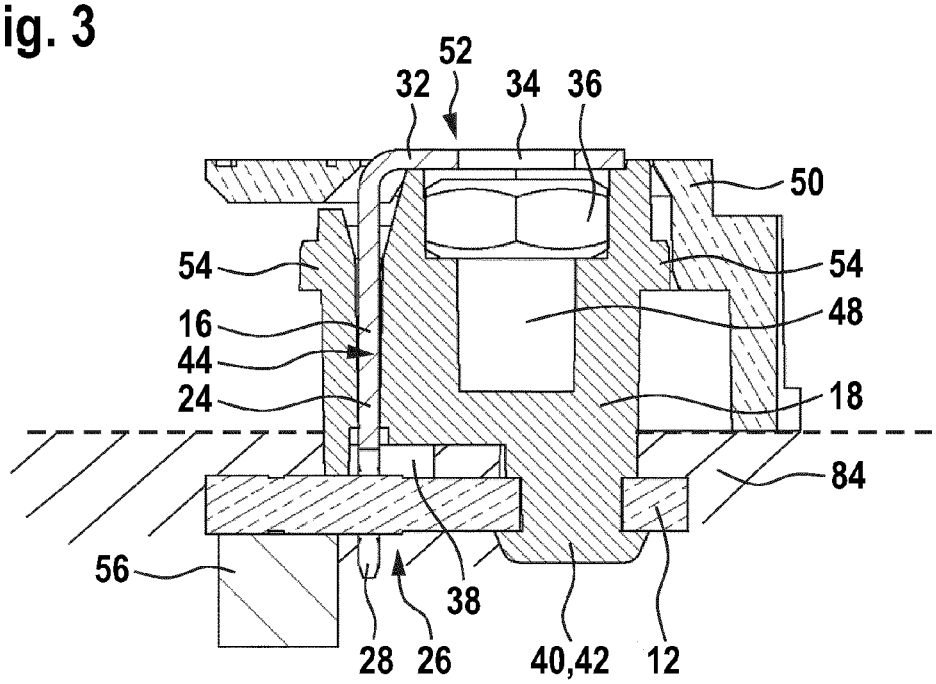
FIG. 3 shows a cross-sectional view of the terminal support of FIG. 2.
Figure 4:
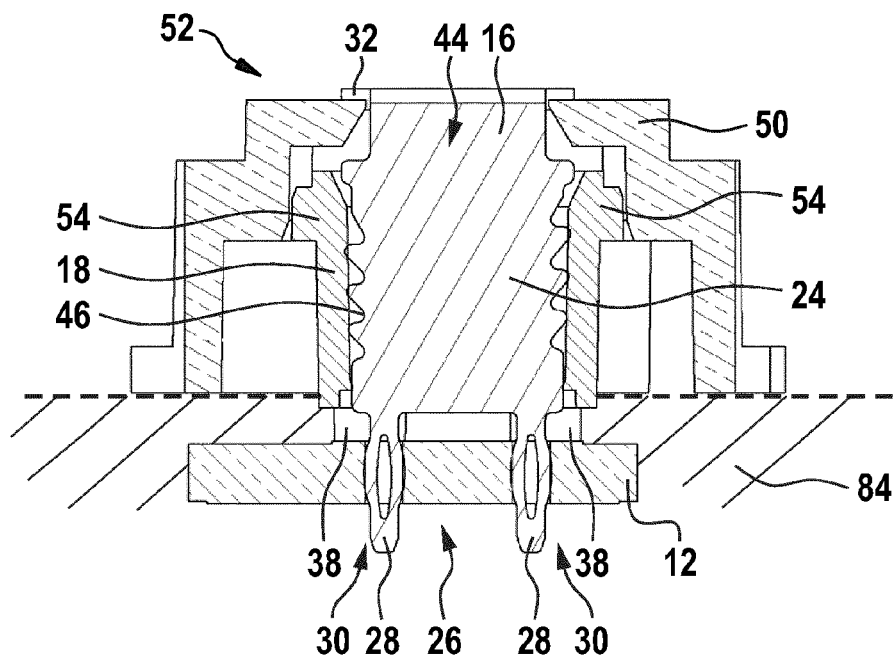
FIG. 4 shows a further cross-sectional view of the terminal support of FIG. 2.

FIG. 2 shows a perspective view of a part of the printed circuit board 10 with an auxiliary terminal 16 and a terminal support 18. FIGS. 3 and 4 show cross-sectional views of the part shown in FIG. 2.

The auxiliary terminal 16 is a bent metal strip with a body 24 that is pressed with a press-fit connection 26 that has two press-fit pins 28 into two corresponding through-holes 30 of the printed circuit board 10. The printed circuit board 10 and/or the metallization layer 14 may be Sn coated at the press-fit connection 26.

On the other end, the auxiliary terminal 16 comprises a head 32, that is connected via a kink with the body 24, such that the head 32 is substantially orthogonal aligned with the body 24. The head 32 comprises an opening 34 through which a screw may be put, that may be screwed into a nut 36 that is accommodated in the terminal support 18.

The terminal support 18 has three pins 38, 40, which are plugged into corresponding holes in the printed circuit board 10. The pins 38 may have a smaller diameter than the pin 40. In general, the terminal support 18 may have at least two pins 38, 40 for receiving torsional forces. It also may be that one or more pins 38, 40 may have different geometries as shown. For example, a pin may have a non-circular cross-section and/or may have an elongated cross-section to be received in a long-hole.

Furthermore, the pin 40 may be longer than the pins 38 and may have been deformed into a cap 42 that fixes the terminal support 18 to the printed circuit board 10. Together with the pin 40, the pins 38 prevent the terminal support 18 from moving and rotating with respect to the printed circuit board 10.

Furthermore, the terminal support 18 has a support channel 44, in which the body 24 of the auxiliary terminal 16 is arranged. The support channel 44 may have substantially the same cross-section as the body 24, for preventing the body 24 from moving and or bending in the support channel 44. As shown in FIG. 4, the body 24 may have a barbed structure 46 on its sides, which anchor the body 24 in the support channel 44. The barbed structure 46 may comprise saw tooth, which interlock with the sidewalls of the support channel 44.

It has to be noted, that the body 24 of the auxiliary terminal 16 may be stuck into the support channel 44 or that the body 24 may be moulded into the terminal support 18.

The nut 36 is accommodated in an opening 48 in the terminal support 18, which opening 48 at least in an upper section may have the same cross-section as the nut 36, to prevent the nut 36 from turning in the opening 48. The nut 36 and the opening 48 are arranged below the head 32 of the auxiliary terminal 16.

FIGS. 3 and 4 additionally show a module cover 50, which is attached above the printed circuit board 10 and which has openings 52 through which the head 32 of the auxiliary terminal 16 and an upper part of the terminal support 18 may protrude. The terminal support 18 may have a rim 54 which is adapted to the interior of the opening 52 to seal the interior of the power semiconductor module.

FIG. 3 furthermore shows that the printed circuit board 10 may be mounted onto a support structure 56 that may be part of the housing 58 of the power semiconductor module 60 shown in FIG. 5.

The housing 58 may comprise a plastics body, which, for example, is mounted to a baseplate 66, on which a power circuit 62 with at least one power semiconductor chip 64 is attached, for example via a substrate. On a side opposite to the baseplate 66, the housing provides several power terminals 68, which are electrically interconnected with the power circuit 62.

On the same side, the housing 58 has an opening 70, in which the support structure 56 is provided. FIG. 5 shows the power semiconductor module 10 in a manufacturing step without the printed circuit board 10. Later, the opening 70 may be closed by the module cover 50.

This support structure 56 comprises fixation bolts 72, which are adapted for being put into the through-holes 20 of the printed circuit board 10. On one side of the support structure 56, a rubber element 74 is provided, which will be arranged between the support structure 56 and the printed circuit board 10. When the printed circuit board 10 is mounted to the support structure 56, the rubber element 74 is used for damping vibration caused by ultrasonic welding wire bonds to the bond pads 22. Therefore, the rubber element 74 is only provided on the side of the support structure 56, above which later the bond pads 22 are positioned.

Figure 6:
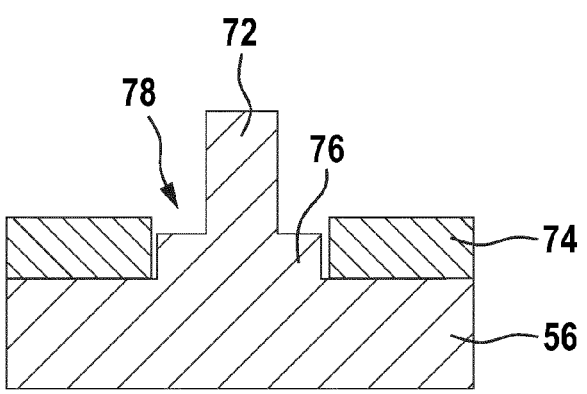
FIG. 6 schematically shows a cross-section through a part of the power semiconductor module of FIG. 5 during the first manufacturing step.

FIG. 6 shows the support structure 56 at one of the bolts 72 in more detail. At its base, the fixation board 72 has a stop 76, which may be a part of the bolt 72 with a larger diameter than a head of the bolt 72. The rubber element 74 has an opening 78 with substantially the same diameter than the stop 76.

Figure 8:
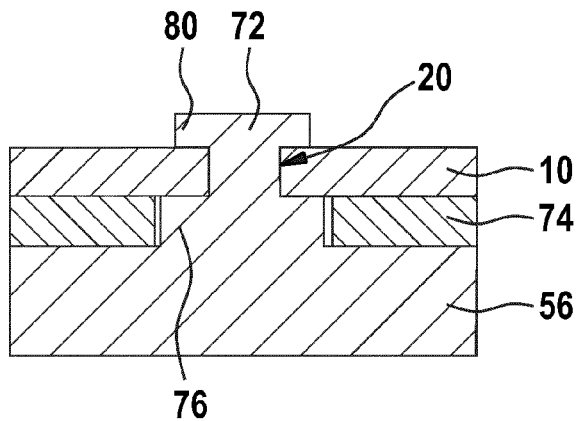
FIG. 8 schematically shows a cross-section through a part of the power semiconductor module of FIG. 7 during the second manufacturing step.

FIG. 7 shows the power semiconductor module 60, after the printed circuit board 10 has been placed onto the support structure 56. The printed circuit board 10 is aligned by the fixation bolts 72 going through the through-holes 20. The printed circuit board 10 is pressed against the stops 76 and fixated onto the support structure 56 by deforming the fixation bolts 72 into a cap 80 as shown in FIG. 8. For example, the tip of the fixation bolts 72 may be deformed by applying temperature or ultrasonic vibrations to form the cap 80.

The distance between the printed circuit board 10 and the support structure 56 is defined by the heights of the stop 76. As is shown in FIG. 6, the rubber element 74 in an uncompressed state is higher than the stop 76. Thus, after the printed circuit board 10 has been pressed onto the support structure 56, the rubber element 74 is also compressed in a defined way. The cap 80 of the fixation bolt 72 keeps the printed circuit board 10 pressed down after the assembly.

FIG. 7 also shows that the printed circuit board 10 and in particular the bond pads 22 may be connected with wire bonds 82 into the interior of the housing 58 to electrically connect the printed circuit board 10 and the auxiliary terminal 16 with the power circuit 62 or other components, such as sensors, inside the housing 58.

FIGS. 1 and 7 show that the bond pads 22 on the printed circuit board 10 are positioned either close to a fixation bolt 72 and/or are located near a line between two fixation bolts 72. This may ensure that below the bond pad 22, the printed circuit board 10 is in a defined connection with the rubber element 74. Unwanted vibrations are efficiently damped and the wire bonding process is stabilized. Also the printed circuit board 10 may not deform, when the bonding tool presses on it.

In the end, the housing 58 of the power semiconductor module 60 may be filled with a filling material 84, as indicated in FIGS. 3 and 4. The filling material 84, for example a silicone gel, may embed the printed circuit board 10 and a lower part of the auxiliary terminals 16 and the terminal support 18 for electrical insulation. For example, the press-fit connection 26 and/or the press-fit pins 28 may be completely embedded in the filling material 84.

Figure 9:
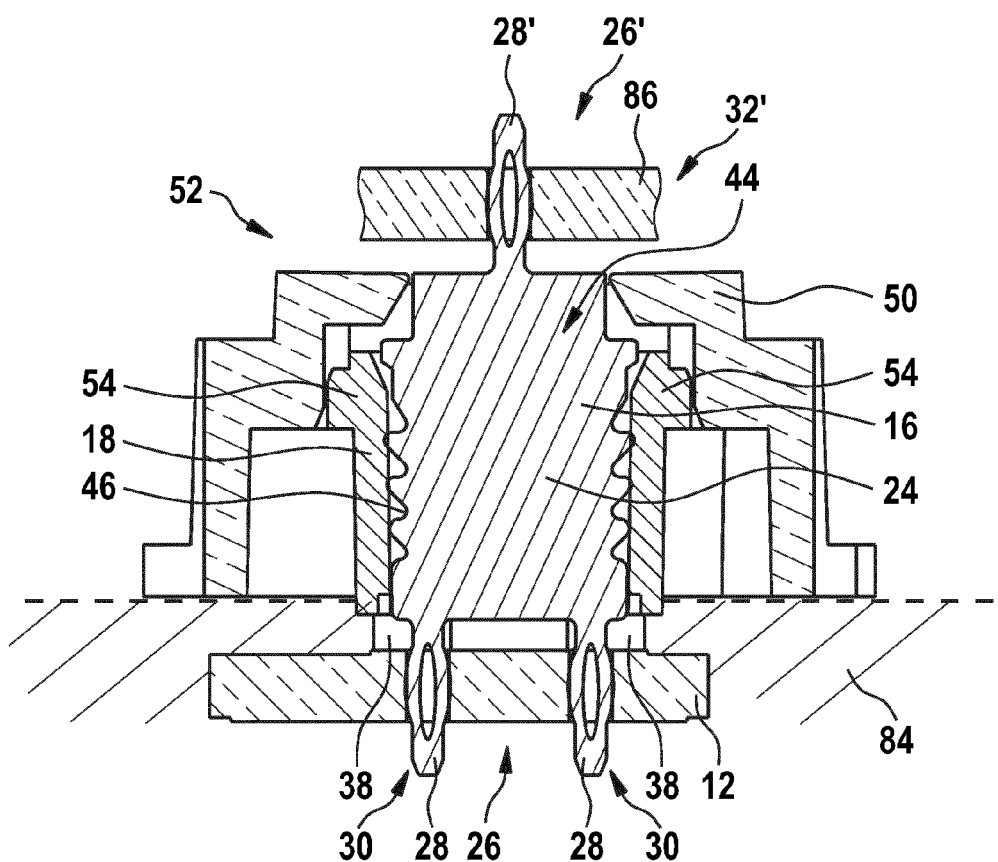
FIG. 9 shows a further cross-sectional view of a part of a power semiconductor module according to an embodiment of the invention.

FIG. 9 shows a further embodiment of a part of the power semiconductor module 60, analogously to FIG. 4 but with a differently designed auxiliary terminal 16. Contrary to FIG. 4, the auxiliary terminal 16 comprises a head 32' with a second press-fit connection 26' with a press-fit pin 28' for a further printed circuit board 86. The press-fit pin 28' protrudes from the body 24 of the auxiliary terminal 16 in a direction opposite to the press-fit-pins 28. For example, the further printed circuit board 86 may be a gate driver board with a gate driver circuit that is electrically connected via the press-fit connection 28', the auxiliary terminal 16 and the press-fit connection 28 with the one or more power semiconductor chips 64 of the power semiconductor module 60.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 printed circuit board
12 plastic body
14 metallisation layer
16 auxiliary terminal
18 terminal support
20 through-hole
22 bond pad
23 opening
24 body
26 press-fit connection
28 press-fit pin
30 through-hole
32 head
34 opening
36 nut
38 pin
40 pin
42 cap
44 support channel
46 barbed structure
48 opening
50 module cover
52 opening
54 rim
56 support structure
58 housing
60 power semiconductor module
62 power circuit
64 power semiconductor chip
66 baseplate
68 power terminal
70 opening
72 fixation bolt
74 rubber element
76 stop
78 opening
80 cap
82 wire bond
84 filling material
26' press fit connection
28' press-fit pin
32' head
86 gate driver board

The invention claimed is:

1. A power semiconductor module, comprising:
a housing accommodating a power circuit with at least one power semiconductor chip, the housing providing at least two power terminals;
a printed circuit board mounted to the housing and electrically connected to the power circuit for distributing auxiliary signals;
at least one auxiliary terminal mounted to the printed circuit board with a press-fit connection provided by a body of the auxiliary terminal;
at least one terminal support mounted to the printed circuit board, the terminal support having a support channel through which the auxiliary terminal is guided with its body;
wherein the terminal support has at least one pin, which is plugged into at least one hole in the printed circuit board.

2. The power semiconductor module of claim 1,
wherein the terminal support has an opening accommodating a nut;
wherein the auxiliary terminal is bent, such that a head of the auxiliary terminal protrudes over the nut.

3. The power semiconductor module of claim 2, wherein the body of the auxiliary terminal has a barbed structure for anchoring the auxiliary terminal in the terminal support.

4. The power semiconductor module of claim 1,
wherein the body of the auxiliary terminal has a barbed structure for anchoring the auxiliary terminal in the terminal support.

5. The power semiconductor module of claim 1,
wherein the auxiliary terminal is insert moulded into the terminal support.

6. The power semiconductor module of claim 1,
wherein a pin of the terminal support is deformed to fix the terminal support on the printed circuit board.

7. The power semiconductor module of claim 1,
wherein the body of the auxiliary terminal has two press-fit pins aligned parallel with the body.

8. The power semiconductor module of claim 1,
wherein the auxiliary terminal comprises a head with a second press-fit connection for a further printed circuit board.

9. The power semiconductor module of claim 1,
wherein the printed circuit board is Sn coated at the press-fit connection.

10. The power semiconductor module of claim 1,
wherein the housing of the power semiconductor module is filled with a filling material into which the press-fit connection of the auxiliary terminal is embedded.

11. The power semiconductor module of claim 1, further comprising:
a module cover attached to the housing above the printed circuit board, wherein the module cover has an opening for guiding the terminal support.

12. The power semiconductor module of claim 1,
wherein the printed circuit board is connected via wire bonds with the power circuit;
wherein the printed circuit board is coated with at least one of Ni or Au, where a wire bond is attached to the printed circuit board.

13. The power semiconductor module of claim 1,
wherein a rubber element is provided between the printed circuit board and the housing of the power semiconductor module;
wherein the rubber element is provided below wire bonds attached to the printed circuit board.

14. The power semiconductor module of claim 13,
wherein the printed circuit board comprises holes for receiving bolts protruding from the housing of the power semiconductor module;
wherein the rubber element comprises openings through which the bolts are guided.

15. The power semiconductor module of claim 14,
wherein at least one of the bolts comprises a stop with a diameter larger than the corresponding opening in the circuit board;
wherein the rubber element is compressed by the printed circuit board pressed against the stop.

16. The power semiconductor module claim 15, wherein at least one bolt is deformed to form a cap to fix the printed circuit board to the housing.

17. The power semiconductor module claim 14, wherein at least one bolt is deformed to form a cap to fix the printed circuit board to the housing.

18. The power semiconductor module of claim 13,
wherein at least one of the bolts comprises a stop with a diameter larger than the corresponding opening in the circuit board;
wherein the rubber element is compressed by the printed circuit board pressed against the stop.

19. The power semiconductor module claim 18, wherein at least one bolt is deformed to form a cap to fix the printed circuit board to the housing.

20. The power semiconductor module of claim 13,
wherein at least one bolt is deformed to form a cap to fix the printed circuit board to the housing.

* * * * *